US010501853B2

(12) United States Patent
Jeon et al.

(10) Patent No.: US 10,501,853 B2
(45) Date of Patent: Dec. 10, 2019

(54) ETCHANT COMPOSITION, METHOD FOR ETCHING MULTILAYERED FILM, AND METHOD FOR PREPARING DISPLAY DEVICE

(71) Applicants: SAMYOUNG PURE CHEMICALS CO., LTD., Chungcheongnam-do (KR); MITSUBISHI GAS CHEMICAL COMPANY, INC., Tokyo (JP); SAMSUNG DISPLAY CO., LTD., Gyeonggi-do (KR)

(72) Inventors: Jung-Ig Jeon, Chungcheongnam-do (KR); Chi-Sung Ihn, Chungcheongnam-do (KR); Mi-Soon Lee, Chungcheongnam-do (KR); Hyun-Eok Shin, Gyeonggi-do (KR); Joon-Woo Bae, Gyeonggi-do (KR)

(73) Assignees: SAMYOUNG PURE CHEMICALS CO., LTD. (KR); MITSUBISHI GAS CHEMICAL COMPANY, INC. (JP); SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 15/518,130

(22) PCT Filed: Oct. 7, 2015

(86) PCT No.: PCT/KR2015/010586
§ 371 (c)(1),
(2) Date: Apr. 10, 2017

(87) PCT Pub. No.: WO2016/056835
PCT Pub. Date: Apr. 14, 2016

(65) Prior Publication Data
US 2017/0306501 A1    Oct. 26, 2017

(30) Foreign Application Priority Data

Oct. 10, 2014 (KR) .................... 10-2014-0136592

(51) Int. Cl.
*H01L 21/00* (2006.01)
*C23F 1/18* (2006.01)
(Continued)

(52) U.S. Cl.
CPC .................. *C23F 1/18* (2013.01); *C23F 1/26* (2013.01); *C23F 1/30* (2013.01);
(Continued)

(58) Field of Classification Search
CPC .............. H01L 21/28008; H01L 21/32; H01L 21/32134; H01L 27/124; H01L 27/125;
(Continued)

(56) References Cited

U.S. PATENT DOCUMENTS 9,580,818 B2    2/2017  Tamai et al.
2004/0118814 A1  6/2004  Kim et al.
(Continued)

FOREIGN PATENT DOCUMENTS

CN    1510169 A    7/2004
CN    1966772 A    5/2007
(Continued)

OTHER PUBLICATIONS

PCT/KR2015/010586 International Search Report dated Jan. 18, 2016; 3 pgs.
(Continued)

*Primary Examiner* — Brook Kebede
(74) *Attorney, Agent, or Firm* — Bracewell LLP; Brad Y. Chin

(57) ABSTRACT

Embodiments provide an etchant composition including (A) a copper ion source, (B) a source of an organic acid ion
(Continued)

having one or more carboxyl groups in a molecule, (C) a fluoride ion source, (D) an etching controller, a surface oxidizing power enhancer or a combination thereof as a first additive, and (E) a surfactant as a second additive; a method for etching a multilayered film; and a method for preparing a display device.

19 Claims, 11 Drawing Sheets

(51) Int. Cl.
    *C23F 1/30* (2006.01)
    *H01L 21/3213* (2006.01)
    *H01L 27/12* (2006.01)
    *C23F 1/26* (2006.01)

(52) U.S. Cl.
    CPC .... *H01L 21/32134* (2013.01); *H01L 27/1259* (2013.01); *H01L 27/124* (2013.01)

(58) Field of Classification Search
    CPC .......... H01L 27/1288; C23F 1/14; C23F 1/18; C23F 1/26; C23F 1/30; C23F 1/44; C09K 13/04; C09K 13/06; C09K 13/08
    USPC ......................................... 438/158
    See application file for complete search history.

(56) References Cited

U.S. PATENT DOCUMENTS

| | | | |
|---|---|---|---|
| 2005/0079649 A1* | 4/2005 | Chang | C09K 13/08 438/79 |
| 2006/0292888 A1 | 12/2006 | Park et al. | |
| 2008/0203390 A1 | 8/2008 | Kim et al. | |
| 2011/0133193 A1 | 6/2011 | Song et al. | |
| 2011/0177680 A1 | 7/2011 | Lee et al. | |
| 2011/0226727 A1 | 9/2011 | Suh et al. | |
| 2012/0322187 A1 | 12/2012 | Choung et al. | |
| 2014/0011352 A1 | 1/2014 | Choung et al. | |
| 2016/0053384 A1 | 2/2016 | Adaniya et al. | |

FOREIGN PATENT DOCUMENTS

| | | |
|---|---|---|
| CN | 103911613 A | 7/2014 |
| CN | 104968838 A | 10/2015 |
| JP | 2006111953 A | 4/2006 |
| JP | 2007005790 A | 1/2007 |
| KR | 1020080069444 A | 7/2008 |
| KR | 20080078093 A | 8/2008 |
| KR | 20090078736 A | 7/2009 |
| KR | 20100035250 A | 4/2010 |
| KR | 20110026050 A | 3/2011 |
| KR | 20110053784 A | 5/2011 |
| KR | 20110063055 A | 6/2011 |
| KR | 20110076468 A | 7/2011 |
| KR | 20110076468 A * | 7/2011 |
| KR | 20110085254 A | 7/2011 |
| KR | 1020110076468 A | 7/2011 |
| KR | 20110105148 A | 9/2011 |
| KR | 1020110120420 A | 11/2011 |
| KR | 20120051488 A | 5/2012 |
| KR | 1020120138290 A | 12/2012 |
| KR | 1020130132246 A | 12/2013 |
| KR | 20140005411 A | 1/2014 |
| KR | 1020140107867 A | 9/2014 |

OTHER PUBLICATIONS

JP2017518890 Office Action dated May 29, 2018; 11 pgs.
CN201580054917.2 Office Action dated Sep. 3, 2018; 21 pgs.

* cited by examiner

ETCHANT COMPOSITION, METHOD FOR ETCHING MULTILAYERED FILM, AND METHOD FOR PREPARING DISPLAY DEVICE

CROSS REFERENCE TO RELATED APPLICATIONS

This application claims the benefit of and priority to PCT/KR2015/010586, filed on Oct. 7, 2015, entitled (translation), "ETCHANT COMPOSITION, METHOD FOR ETCHING MULTILAYERED FILM, AND METHOD FOR PREPARING THE SAME," which claims the benefit of and priority to Korean Patent Application No. 10-2014-0136592, filed on Oct. 10, 2014, each of which is hereby incorporated by reference in their entirety into this application.

BACKGROUND

Field

Embodiments relate to an etchant composition, a method for etching a multilayered film, and a method for preparing a display device. For example, embodiments relate to an etchant composition used for etching a multilayered film containing copper and titanium, a method for etching a multilayered film containing copper and titanium using the same, and a method for preparing a display device using the same.

Description of Related Art

Conventionally, aluminum or an aluminum alloy has been used as a wiring material of a display device such as a flat panel display. However, recently, in view of the enlargement of displays, as well as the implementation of high resolution therein, a problem of signal delay due to a phenomenon such as wiring resistance, or the like, may occur, whereby it may be difficult to uniformly display a screen.

Therefore, research into the adoption of a wiring, in which copper, a material having relatively low resistance, is a main component, has been undertaken. However, when copper is used for a gate wiring, adhesiveness between a substrate such as glass, or the like, and copper, may not be sufficient. In addition, when copper is used for a source drain wiring, a problem of diffusion toward a silicon semiconductor film, a substrate thereof, may occur. Therefore, in order to prevent the problem described above, research into the stacking of a barrier film in which metal, having not only high adhesiveness to a substrate such as glass or the like but also barrier properties in which diffusion toward a silicon semiconductor film is limited, is disposed has been undertaken. The metal may be a metal such as titanium (Ti) or molybdenum (Mo), and the multilayer thin film may be a multilayer thin film of copper or alloys thereof.

On the other hand, such a multilayer thin film wiring may be obtained, as a multilayer thin film is formed on a substrate such as glass, or the like, in a film formation process such as a sputtering method, or the like, and an electrode pattern may be formed by etching using a resist or the like as a mask thereafter. An etching method may be a wet method using an etchant and a dry method using an etching gas such as plasma, or the like. In this case, the etchant used in the wet method is required (i) to have high machining accuracy, (ii) not to generate an etching residue, (iii) to have high stability and safety of a component and to allow for easy handling of the component, (iv) to have a stable etching performance, and the like.

On the other hand, an etchant used in an etching process of copper in general may be an etchant containing hydrogen peroxide as a main component, an etchant containing persulfate as a main component, and the like. However, an etchant containing a component such as hydrogen peroxide or persulfate may have a problem in which productivity may be reduced and an amount of waste liquid may be increased due to a change over time caused by instability of a liquid, and may have a problem in which a risk may be increased by heat and gas generated by rapid decomposition.

On the other hand, as an etchant used for an etching process of copper not containing peroxide, or the like, an ammonia alkaline etchant containing a copper ion and ammonia is known. However, since such an alkaline etchant has a high pH, a large amount of ammonia is volatilized from the etchant. Therefore, due to a reduction in the concentration of ammonia, an etching rate may vary, or a working environment may be significantly degraded. In addition, when pH is high, a problem in which a resist is dissolved may occur. On the other hand, since pH is adjusted within a neutral range, ammonia may be prevented from being volatilized from an etchant. In this case, when an alkaline etchant is rinsed with water, a problem in which a residue is precipitated may occur. On the other hand, in the case of an ammonia alkaline etchant containing a copper ion and ammonia, titanium etching is also limited.

SUMMARY

Embodiments provide an etchant composition not causing the problem described above, but having various advantages which will be described later, a method for etching a multilayered film using the same, and a method for preparing a display device using the same.

An objective of various embodiments is not limited to the above description. An objective of the various embodiments may be understood from the overall content of the present disclosure, and additional objectives of the various embodiments will be readily apparent to those skilled in the art to which the present disclosure belongs.

According to at least one embodiment, there is provided an etchant composition including: (A) a copper ion source; (B) a source of an organic acid ion having one or more carboxyl groups in a molecule; (C) a fluoride ion source; (D) an etching controller, a surface oxidizing power enhancer, or a combination thereof, as a first additive; and (E) a surfactant, as a second additive.

According to at least one embodiment, in the etchant composition, the contents of (A) to (E) may be 0.02 mol/kg to 1.0 mol/kg of (A) the copper ion source; 0.01 mol/kg to 3.0 mol/kg of (B) the source of an organic acid ion having one or more carboxyl groups in a molecule; 0.01 mol/kg to 1.0 mol/kg of (C) the fluoride ion source; 0.01 mol/kg to 3.0 mol/kg of (D) the first additive; and 1.0 ppm to 30,000 ppm of (E) the second additive.

According to at least one embodiment, (A) the copper ion source, may be at least one selected from the group consisting of copper, copper sulfate, copper nitrate, copper chloride, copper fluoride, copper phosphide, copper hydroxide, copper acetate, copper citrate, copper lactate, copper oleate, a copper silicon compound, copper bromide, and copper carbonate.

According to at least one embodiment, (B) the source of an organic acid ion having one or more carboxyl groups in a molecule, may be at least one selected from the group consisting of formic acid, acetic acid, propionic acid, butyric acid, caproic acid, caprylic acid, capric acid, lauric acid, stearic acid, gluconic acid, citric acid, tartaric acid, malic acid, succinic acid, oxalic acid, maleic acid, and an ammonium salt thereof.

According to at least one embodiment, a mixing ration of (B) the source of an organic acid ion with respect to (A) the copper ion source may be 0.01 to 150.0 times on a molar basis According to at least one embodiment, (C) the fluoride ion source may be at least one selected from the group consisting of hydrofluoric acid, ammonium fluoride, acid ammonium fluoride, potassium fluoride, ammonium fluoroborate, potassium bisulfite, potassium borofluoride, sodium fluoride, sodium bisulfite, aluminum fluoride, boron fluoride, lithium fluoride, calcium fluoride, and copper fluoride.

According to at least one embodiment, a mixing ratio of (C) the fluoride ion source with respect to (A) the copper ion source may be 0.01 to 50.0 times on a molar basis.

According to at least one embodiment, (D) the etching controller, as a first additive, may preferably be a halogen ion source except a fluorine ion. In more detail, the etching controller may be at least one selected from the group consisting of hydrochloric acid, potassium chloride, sodium chloride, ammonium chloride, bromic acid, potassium bromide, sodium bromide, ammonium bromide, iodic acid, potassium iodide, sodium iodide, and ammonium iodide.

According to at least one embodiment, (D) the surface oxidizing power enhancer, as a first additive, may preferably be an inorganic acid. In more detail, the surface oxidizing power enhancer may be at least one selected from the group consisting of sulfuric acid, nitric acid, phosphoric acid, and hydrochloric acid.

According to at least one embodiment, a mixing ratio of (D) the first additive with respect to (A) the copper ion source may be 0.01 to 150.0 times on a molar basis.

According to at least one embodiment, (E) the surfactant, as a second additive, may preferably be a nonionic surfactant. In more detail, the surfactant may be at least one selected from the group consisting of polyethyleneglycol, polypropyleneglycol, polyetherpolyol, polyglycololeicacid, gelatin, and an ethylene oxide (EO)-propylene oxide (PO) copolymer.

According to at least one embodiment, the etchant composition may further include (F) an alkali metal salt, as a third additive.

According to at least one embodiment, (F) the alkali metal salt, as a third additive, may be at least one selected from the group consisting of an alkali metal salt containing halogen, an alkali metal salt of an organic acid having one or more carboxyl groups in a molecule, and an alkali metal salt of a strong alkali.

According to at least one embodiment, in the etchant composition, the content of (F) the third additive may be 0.01 mol/kg to 2.0 mol/kg.

According to at least one embodiment, a mixing ratio of (F) the third additive with respect to (A) the copper ion source may be 0.01 to 100 times on a molar basis.

According to at least one embodiment, the etchant composition may have a pH value of 3 or less.

According to at least one embodiment, the etchant composition may be an etchant composition used for etching a multilayered film containing copper and titanium.

According to another embodiment, there is provided a method for etching a multilayered film including: contacting an etchant composition including (A) a copper ion source, (B) a source of an organic acid ion having one or more carboxyl groups in a molecule, (C) a fluoride ion source, (D) an etching controller, a surface oxidizing power enhancer, or a combination thereof, as a first additive, and (E) a surfactant, as a second additive, with a multilayered film containing copper and titanium.

According to at least one embodiment, the etchant composition may not contain hydrogen peroxide and persulfate.

According to another embodiment, there is provided a method for preparing a display device including: forming a gate pattern, forming a gate line and a gate electrode connected to each other on a substrate; forming data pattern, forming a data line intersecting, while being insulated from, the gate line, a source electrode connected to the data line, and a drain electrode spaced apart from the source electrode; forming a pixel electrode connected to the drain electrode; and forming a common electrode insulated from the pixel electrode, wherein at least one of the forming a gate pattern and the forming a data pattern includes forming a metal layer on the substrate, and etching the metal layer with an etchant composition.

According to at least one embodiment, the etchant composition may include (A) a copper ion source, (B) a source of an organic acid ion having one or more carboxyl groups in a molecule, (C) a fluoride ion source, (D) an etching controller, a surface oxidizing power enhancer, or a combination thereof, as a first additive, and (E) a surfactant, as a second additive.

According to at least one embodiment, the metal layer may be a multilayered film including a copper film and a titanium film.

According to at least one embodiment, the metal layer may be a multilayered film including a copper film and a molybdenum film.

In addition, the solution of the problem described above does not list all the features of the various embodiments. In the present disclosure, various features in addition to advantages and effects due to the various features may be understood in more detail with reference to the following specific embodiments.

According to at least one embodiment, an etchant composition according to various examples may be not required to include hydrogen peroxide or persulfate. Thus, generation of a gas or heat caused by a decomposition reaction thereof may be prevented. As a result, etching may be stably performed. In addition, since pH of a liquid is low, a lifting phenomenon of a photoresist caused by high pH may not occur. Due to excellent lifespan, a liquid replacement time is long. Thus, an amount of a waste liquid is reduced, whereby the etchant composition is environmentally friendly and economical.

On the other hand, when an etchant composition according to various embodiments is used, an etching rate of a multilayered film may be freely adjusted, critical dimension loss may be significantly reduced, an etching residue or a precipitation may be prevented from being generated, linearity may be significantly increased, and surface roughness may be significantly reduced. Furthermore, when an etchant composition according to the present disclosure is used, an angle of a metal pattern may be freely adjusted. Thus, 40°±10° may be implemented.

DETAILED DESCRIPTION

Figure 1:
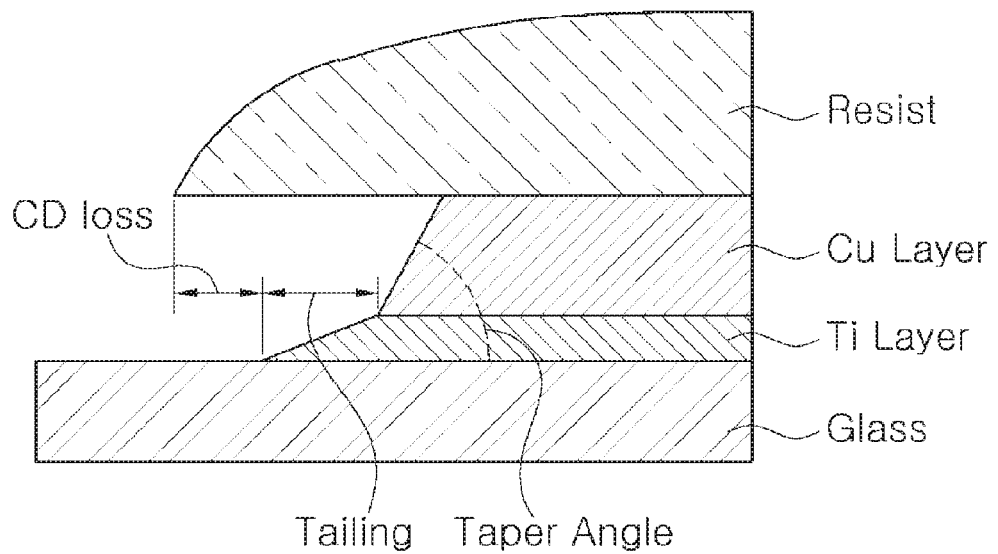
FIG. 1 is a cross-sectional view exemplarily illustrating an etching result of a multilayered film containing copper and titanium according to an embodiment.

FIGS. 6A, 8A, 9A, and 10A are plan views sequentially illustrating a method of manufacturing a display device according to an embodiment.

FIGS. 5, 6B, 7, 8B, 9B, 10B, and 11 are cross-sectional views sequentially illustrating a method of manufacturing a display device according to an embodiment.

FIGS. 6B, 8B, 9B, and 10B are cross-sectional views taken along line I-I' of FIGS. 6A, 8A, 9A, and 10A.

Hereinafter, various embodiments will be described in detail with reference to the drawings. However, the embodiments may be modified into various other forms, and the scope is not limited to the embodiments described below. Furthermore, the embodiments are provided to more fully describe the present disclosure to those skilled in the art.

1. Etchant Composition

The inventors of the various embodiments have conducted research to solve the problems described above. As a result, when a multilayered film containing copper and titanium using an etchant composition including a copper ion source, a source of an organic acid ion having one or more carboxyl groups in a molecule, and a fluoride ion source, and additionally including a combination of specific additives, it has been found that not only the problems described above may be solved, but also there are various excellent advantages.

In more detail, an etchant composition according to at least one embodiment may include: (A) a copper ion source; (B) a source of an organic acid ion having one or more carboxyl groups in a molecule; (C) a fluoride ion source; (D) an etching controller, a surface oxidizing power enhancer or a combination thereof, as a first additive; and (E) a surfactant, as a second additive.

Hereinafter, each component forming an etchant composition according to at least one embodiment will be described in more detail.

(A) Copper Ion Source

A copper ion source included in the etchant composition according to at least one embodiment (hereinafter, simply referred to as component (A)) is a component acting as an oxidizing agent of copper. The copper ion source is not particularly limited as long as it may supply a copper ion. For example, the copper ion source may be, in addition to copper, a copper inorganic salt such as copper sulfate, copper nitrate, copper chloride, copper fluoride, copper phosphide, copper hydroxide, or the like; a copper organic salt such as copper acetate, copper citrate, copper lactate, copper oleate, or the like; a metal salt containing copper such as a copper silicon compound, copper bromide, copper carbonate, or the like; or the like. The copper ion source may be used alone, or a plurality of copper ion sources may be used in combination.

There are no limitations, and in at least one embodiment, the copper ion source may be, preferably copper, copper nitrate, copper sulfate, copper hydroxide, and copper acetate, among them, and more preferably copper sulfate, copper nitrate, and copper acetate. In this case, the copper ion source may more excellently perform a role of an oxidizing agent of copper.

On the other hand, the copper ion source is included in an etchant composition of 1 kg, preferably in the range of 0.02 mol to 1.0 mol. When the copper ion source less than 0.02 mol is included, a copper etching rate may not be in a satisfactory level. When the copper ion source exceeding 1.0 mold is included, a copper etching rate may increase. Thus, there may be limitations on controlling the etching rate, and a probability of precipitation increases. A more preferable range thereof is the range of 0.1 mol to 0.5 mol. When the content of a copper ion source in an etchant composition according to at least one embodiment is within the range described above, a better etching rate may be obtained.

(B) Source of Organic Acid Ion

A source of an organic acid ion included in an etchant composition according to at least one embodiment (hereinafter, simply referred to as component (B)) basically functions as an etching agent of copper by forming a complex with a copper ion, and further has functions of improving stability of an etchant composition and stabilizing an etching rate. In addition, in a water rinsing process after etching, the source of an organic acid ion may have an effect of suppressing generation of a residue precipitated when an etchant composition is diluted with water. The source of an organic acid ion is not particularly limited as long as it may be an organic acid compound having one or more carboxyl groups in a molecule. For example, the source of an organic acid ion may be formic acid, acetic acid, propionic acid, butyric acid, caproic acid, caprylic acid, capric acid, lauric acid, stearic acid, gluconic acid, citric acid, tartaric acid, malic acid, succinic acid, oxalic acid, maleic acid, an ammonium salt thereof, or the like. The source of an organic acid ion may be used alone, or a plurality of organic acid ion sources may be used in combination.

There are no limitations, and an etchant composition according to at least one embodiment may preferably be a source of an organic acid ion having two or more carboxyl groups in a molecule as a source of an organic acid ion among the compounds described above. In this regard, the source of an organic acid ion having two or more carboxyl groups in a molecule may have excellent solubility with respect to water and stability in an etchant composition, and may further improve etching performance. In more detail, the etchant composition may preferably be citric acid, tartaric acid, oxalic acid, maleic acid, an ammonium salt thereof, or the like, but is not limited thereto.

On the other hand, the source of an organic acid ion is included in an etchant composition of 1 kg, preferably in the range of 0.01 mol to 3.0 mol. When the source of an organic acid ion is included in an amount less than 0.01 mol, a copper etching rate may not be satisfactory. When the source of an organic acid ion is included in an amount exceeding 3.0 mol, a copper etching rate may increase. Thus, there may be limitations on controlling the etching rate. A more preferable range is the range of 0.1 mol to 2.0 mol. In addition, a mixing ratio of the source of an organic acid ion with respect to the copper ion source is preferably 0.01 to 150.0 times, and more preferably, 0.1 to 40.0 times, on a molar basis. When the content and a mixing ratio of a source of an organic acid ion in an etchant composition according to at least one embodiment are within the range described above, a better etching rate may be obtained and the generation of a precipitated residue may effectively be suppressed.

(C) Fluoride Ion Source

A fluoride ion source included in an etchant composition according to at least one embodiment (hereinafter, simply referred to as component (C)) has a function of improving etching ability of titanium. The fluoride ion source is not particularly limited as long as it may supply a fluorine ion. For example, the fluoride ion source may be hydrofluoric acid, ammonium fluoride, acid ammonium fluoride, potassium fluoride, ammonium fluoroborate, potassium bisulfite, potassium borofluoride, sodium fluoride, sodium bisulfite, aluminum fluoride, boron fluoride, lithium fluoride, calcium fluoride, copper fluoride, or the like. The fluoride ion source may be used alone, or a plurality of fluoride ion sources may be used in combination.

There are no limitations, and in an etchant composition according to at least on embodiment, the fluoride ion source may be, preferably hydrofluoric acid, ammonium fluoride, acid ammonium fluoride, potassium fluoride, and sodium fluoride, and more preferably ammonium fluoride, acid ammonium fluoride, and potassium fluoride. In this case, the fluoride ion source may more excellently perform a role of an oxidizing agent of titanium.

On the other hand, the fluoride ion source may be included in an etchant composition of 1 kg, preferably in the range of 0.01 mol to 1.0 mol, and more preferably in the range of 0.1 mol to 0.5 mol. In addition, a mixing ratio of the fluoride ion source with respect to the copper ion source is preferably 0.01 to 50.0 times, and more preferably, 0.01 to 5.0 times, on a molar basis. When the content of a fluoride ion source in an etchant composition according to at least one embodiment is within the range described above, a better etching rate may be obtained. When the fluoride ion source is included in an amount less than 0.1 mol, a titanium etching rate may not be satisfactory. When the fluoride ion source exceeds 1.0 mol, a titanium etching rate may increase. Thus, damage to glass, a base material, may be intensified or limited to being controlled.

On the other hand, when a fluoride ion source in which two atoms of fluorine are contained in a molecule such as acid ammonium fluoride, acid potassium fluoride, or the like, as a component (C), the content of the component (C) is defined as being twice the content of a fluoride ion source.

In addition, a fluoride ion source included in an etchant composition may not be dissociated in a liquid as a fluorine ion (F), or may be present as a difluoride hydrogen ion ($HF_2^-$). However, a mol number, in the case that the fluoride ion source is fully dissociated, is the content of the component (C).

In addition, a fluoride salt of copper such as copper fluoride, or the like may act as the component (C) while having a function as the component (A) described above. Thus, when a fluoride salt of copper is included in an etchant composition according to at least one embodiment, the content of the component (A) may be a content in which another copper ion source and a fluoride salt of copper are totalled, and the content of the component (C) may be the content in which another fluoride ion source and a fluoride salt of copper are totalled.

(D) First Additive

An etchant composition according to at least one embodiment may further include an etching controller, a surface oxidizing power enhancer or a combination thereof, as a first additive (hereinafter, simply referred to as component (D)). According to the study of the inventors of the various embodiments, as described above, when an etching controller and/or a surface oxidizing power enhancer is further included, as a first additive, a further excellent etching rate may be obtained as compared to the case in which the etching controller and/or the surface oxidizing power enhancer is not further included, as a first additive. Furthermore, generation of an etching residue or a precipitation may be significantly reduced. In more detail, when an etching controller is further included, a further excellent etching rate may be obtained as compared to the case in which the etching controller is not further included. When a surface oxidizing power enhancer is further included in addition thereto, the generation of an etching residue or a precipitation may be also significantly reduced.

On the other hand, the etching controller may adjust an etching rate of a copper layer, and an etching controller known in the art may be used without limitation as long as it may have an effect as described above. For example, there are no limitations, and the etching controller may preferably be a halogen ion source such as hydrochloric acid, potassium chloride, sodium chloride, ammonium chloride, bromic acid, potassium bromide, sodium bromide, ammonium bromide, iodic acid, potassium iodide, sodium iodide, ammonium iodide, or the like, except the fluorine ion. The etching controller may be used alone, or a plurality of etching controllers may be used in combination.

In addition, the surface oxidizing power enhancer allows a surface of copper to be easily oxidized, when an exposed copper layer outside a photoresist is etched, in order to smoothly perform etching. As long as the surface oxidizing power enhancer has an effect described above, a surface oxidizing power enhancer commonly known in the art may be used without limitation. For example, there are no limitations, and the surface oxidizing power enhancer may preferably be an inorganic acid such as sulfuric acid, nitric acid, phosphoric acid, hydrochloric acid, or the like. The surface oxidizing power enhancer may be used alone, or a plurality of surface oxidizing power enhancers may be used in combination. On the other hand, in the case of inorganic acid containing a halogen element such as hydrochloric acid, or the like, the inorganic acid may functions as an etching controller described above.

On the other hand, the first additive is included in an etchant composition of 1 kg, preferably in the range of 0.01 mol to 3.0 mol, more preferably in the range of 0.1 mol to 2.0 mol, and further more preferably in the range of 0.5 mol to 1.5 mol. In addition, a mixing ratio of the first additive with respect to the copper ion source may be, preferably 0.01 to 150.0 times, more preferably 0.1 to 40.0 times, and further more preferably 1.0 to 15.0 times on a molar basis. When the content of the first additive is less than 0.01 mol, an etching rate may be slower than a target level or surface oxidizing power may be reduced. Thus, a residue or a precipitation may be generated. When the content of the first additive exceeds 3.0 mol, an etching rate may increase. Thus, control may be limited, or a lifting phenomenon of a resist may occur. When the content of the first additive in the etchant composition according to at least one embodiment is within the range, a more excellent etching rate may be obtained, and the generation of a residue or a precipitation may be significantly reduced.

(E) Second Additive

An etchant composition according to at least one embodiment may further include a surfactant, as a second additive (hereinafter, simply referred to as component (E)) with the first additive. According to the research of the inventors of the various embodiments, as described above, when a surfactant is further included, as a second additive, linearity may be significantly increased, surface roughness may be significantly reduced, and further, a taper angle of a metal pattern may be freely adjusted, as compared to the case in which the surfactant is not further included.

On the other hand, the surfactant is a surfactant commonly known in the art. As long as the surfactant has an effect as described above, the surfactant is not particularly limited. However, the surfactant may preferably be a nonionic surfactant among the above-mentioned compounds. For example, the nonionic surfactant may be an alcohol-based nonionic surfactant such as polyethyleneglycol, polypropyleneglycol, polyetherpolyol, polyglycololeicacid, or the like; or a polymer-based compound such as gelatin, an ethylene oxide (EO)-propylene oxide (PO) copolymer, or the like, but is not limited thereto. The surfactant may be used alone, or a plurality of surfactants may be used in combination.

On the other hand, the second additive is included in an etchant composition of 1 kg, preferably in the range of 1.0 ppm to 30,000 ppm, more preferably in the range of 1.0 ppm to 20,000 ppm, and further more preferably in the range of 5.0 ppm to 10,000 ppm. When the content of the second additive is less than 1.0 ppm, there may be limitations on adjusting an angle of a metal pattern within a desired range. When the content thereof exceeds 30,000 ppm, an etching rate of copper may be reduced. Thus, a desired copper etching rate may not be obtained. When the content of the second additive in an etchant composition according to at least one embodiment is within the range, linearity may effectively be significantly increased, surface roughness may effectively be significantly reduced, and further a taper angle of a metal pattern may effectively be adjusted within a desired range.

(F) Third Additive

An etchant composition according to at least one embodiment may further include an alkali metal salt, as a third additive (hereinafter, simply referred to as component (F)) with the first additive and the second additive as needed. According to the research of the inventors of the various embodiments, as described above, when the alkali metal salt may be further included, as the third additive, it has an effect of improving surface roughness of a metal pattern, as compared to the case in which the alkali metal salt is not included.

On the other hand, as long as the alkali metal salt has an effect described above, the alkali metal salt is not particularly limited. However, the alkali metal salt may preferably be an alkali metal salt containing a halogen such as potassium fluoride, sodium fluoride, potassium chloride, sodium chloride, potassium bromide, sodium bromide, potassium iodide, sodium iodide, or the like; an alkali metal salt of an organic acid having one or more carboxyl groups such as potassium citrate, sodium citrate, potassium acetate, sodium acetate, potassium oxalate, potassium lactate, or the like; and an alkali metal salt of a strong alkali, such as sodium hydroxide, potassium hydroxide, or the like. The alkali metal salt may be used alone, or a plurality of alkali metal salts may be used in combination.

On the other hand, the third additive is included in an etchant composition of 1 kg, preferably in the range of 0.01 mol to 2.0 mol, more preferably in the range of 0.05 mol to 1.0 mol, and further more preferably in the range of 0.1 mol to 0.5 mol. In addition, a mixing ratio of the third additive with respect to the copper ion source may be, preferably 0.01 to 100.0 times, more preferably 0.05 to 20.0 times, and further more preferably 0.1 to 5.0 times on a molar basis. When the content of the third additive is less than 0.01 mol, surface roughness of a metal pattern may be poor. When the content thereof exceeds 2.0 mol, a copper etching rate may be slower or precipitation may occur. When the content of the third additive in an etchant composition according to at least one embodiment is within the range, it has an effect of improving surface roughness of a metal pattern.

On the other hand, an alkali metal salt containing fluorine such as potassium fluoride, sodium fluoride, or the like may have a function as a fluoride ion source described above. In addition, an alkali metal salt, containing halogen other than fluorine, such as potassium chloride, sodium chloride, potassium bromide, sodium bromide, potassium iodide, sodium iodide, or the like, may have a function as a halogen ion source except a fluorine ion as described above. Thus, when an alkali metal salt containing fluorine is included in an etchant composition according to at least one embodiment, the content of the component (C) may be the content in which another fluoride ion source and an alkali metal salt containing fluorine are totalled. In addition, the content of the component (F) may be the content in which another third additive and an alkali metal salt containing fluorine are totalled. In a manner similar thereto, when an alkali metal salt containing halogen other than fluorine is included in an etchant composition according to at least one embodiment, the content of the component (D) may be the content in which another first additive and an alkali metal salt containing halogen other than fluorine are totalled. In addition, the content of the component (F) may be the content in which another third additive and an alkali metal salt containing halogen other than fluorine are totalled.

(G) Other Additives

An etchant composition according to at least one embodiment may include, in addition to components described above, as needed, water and various other additives used according to the related art for an etchant composition for etching, in the range not inhibiting an effect of an etchant composition described above. For example, water may preferably be water from which a metal ion, organic impurities, particles, and the like have been removed by distillation, an ion exchange treatment, a filter treatment, various adsorption treatments, and the like, more preferably pure water, and further more preferably ultrapure water. In addition, other additives may be a pH adjusting agent. In this case, the pH adjusting agent is not particularly limited as long as it does not inhibit an effect of the etchant composition.

On the other hand, an etchant composition according to at least one embodiment is capable of etching a multilayered film containing copper and titanium, even when hydrogen peroxide or persulfate is not included. Thus, the etchant composition may not include hydrogen peroxide or persulfate.

On the other hand, an etchant composition according to at least one embodiment may further include an azole-based compound commonly used in the art for adjusting a desired taper angle of a metal pattern, or may not include the azole-based compound.

(H) pH

An etchant composition according to at least one embodiment may preferably have a pH value of 3 or less. When a pH value exceeds 3, an etching rate may be lowered and a lifting phenomenon of a resist may occur. However, when pH is significantly low, an etching rate may be significantly high, and thus, there may be limitations on controlling an etching time.

2. Method for Etching Multilayered Film

An etching method according to at least one embodiment, a method of etching a multilayered film containing copper and titanium, includes contacting the multilayered film with an etchant composition in the various embodiments described above.

In an etching method according to at least one embodiment, a multilayered film containing copper and titanium is an etching object. A multilayered film, an etching object, may have a multilayered structure including a layer of copper or a compound in which copper is a main component, and a layer of titanium or a compound in which titanium is a main component. The multilayered film may be a 2-layer film, in which a layer of copper or a compound in which copper is a main component and a layer of titanium or a compound in which titanium is a main component are stacked, a 3-layer film, in which a layer of titanium or a compound in which titanium is a main component, a layer of copper or a compound in which copper is a main component, and a layer of titanium or a compound in which titanium is a main component, are stacked, or the like.

Copper or a compound in which copper is a main component may be copper (a metal) or copper alloy, or copper oxide, copper nitride, or the like. Titanium or a compound in which titanium is a main component may be titanium (a metal) or titanium alloy, or oxide or nitride thereof, or the like.

For example, an etching object may be obtained, as the multilayered film described above is formed on a substrate such as a glass, or the like, an upper surface thereof is coated with a resist, a desired pattern mask is exposed and transferred, and a desired resist pattern is formed by development. A substrate for formation of a multilayered film may be, in addition to a glass substrate, for example, a substrate having a layered structure in which a gate wiring is formed on a glass plate, and an insulating film formed of silicon nitride, or the like is prepared on the gate wiring. In the present disclosure, as the etchant composition is in contact with an etching object to etch a multilayered film and a desired multilayered film wiring is formed, a multilayered film wiring, in which a multilayered film including a layer formed by containing titanium and a layer formed by containing copper is prepared, may be obtained. The multilayered film wiring containing copper and titanium may preferably be used for a wiring, or the like, of a display device such as a flat panel display, or the like.

A method of contacting an etching object with an etchant composition is not particularly limited, and may be, for example, a wet etching method such as a method of contacting an object by dropping (single wafer spin processing) an etchant composition, spraying thereof, or the like, a method of immersing an etching object in an etchant composition, or the like. In the various embodiments, any method may be performed for etching. In detail, a method of contacting an etching object with an etchant composition by spraying is preferably used. In addition, the method of contacting an object with an etchant composition by spraying may be a method of spraying an etchant composition downwards from a position above an etching object, a method of spraying an etchant composition upwards from a position below an etching object, or the like. In this case, a spray nozzle may be fixed, or may perform an operation in which a neck moves, sliding-moves, or the like. In addition, the spray nozzle may be installed vertically downwards, or may be installed at an incline. An etching object may be fixed, or an operation such as oscillating, rotating, or the like, may be applied thereto. Alternatively, the etching object may be horizontally placed or may be placed at an incline.

A temperature in which an etchant composition is used may preferably be a temperature of 10° C. to 70° C. In detail, the temperature is preferably 20° C. to 50° C. When a temperature of an etchant composition is 10° C. or greater, an etching rate becomes good. Thus, excellent production efficiency may be obtained. On the other hand, when a temperature thereof is 70° C. or less, a change in a liquid composition is suppressed. Thus, etching conditions may be uniformly maintained. By raising a temperature of an etchant composition, an etching rate may be increased. After considering a small composition changed in an etchant composition by suppressing, it may be required to appropriately determine an optimum processing temperature.

3. Method for Preparing Display Device

Figure 4A:
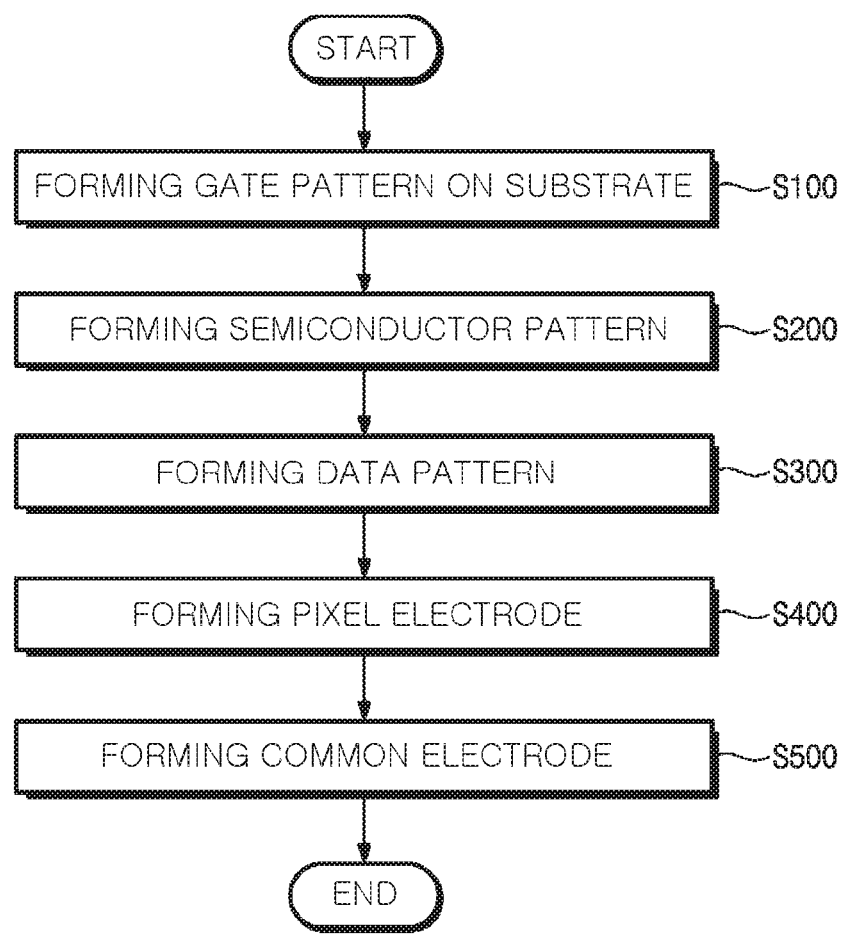
FIGS. 4A and 4B are flow charts illustrating a method of manufacturing a display device according to an embodiment.
Figure 4B:
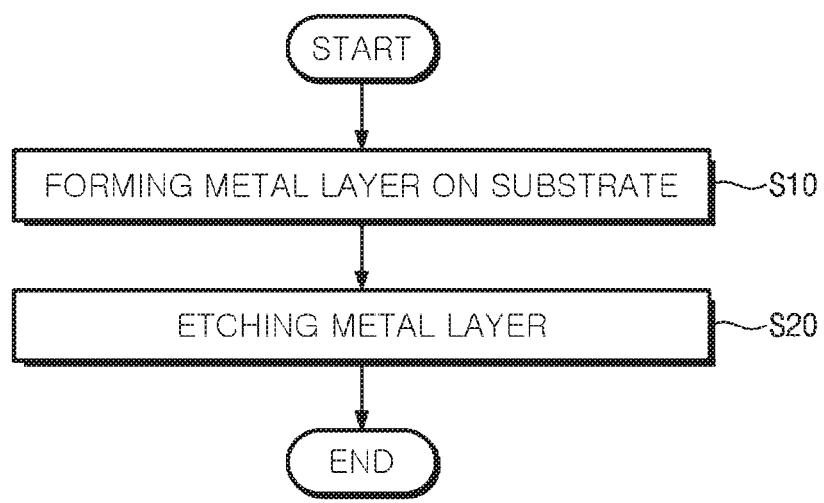

FIGS. 4A and 4B are flow charts illustrating a method of manufacturing a display device according to at least one embodiment.

With reference to FIG. 4A, a method for preparing a display device according to at least one embodiment may include: forming a gate pattern forming a gate line and a gate electrode connected to each other on a substrate (s100); forming a semiconductor pattern on the gate electrode (s200); forming a data pattern forming a data line intersecting, while being insulated from, the gate line, a source electrode connected to the data line, and a drain electrode spaced apart from the source electrode (s300); forming a pixel electrode connected to the drain electrode (s100); and forming a common electrode insulated from the pixel electrode (s500).

With reference to FIG. 4B, at least one of the forming a gate pattern (s100) and the forming a data pattern (s300) may include: forming a metal layer on a substrate (s10); and etching the metal layer with an etchant (s20).

According to at least one embodiment, the forming a metal layer on a substrate (s10) may include forming a first metal layer on the substrate and forming a second metal layer on the first metal layer. The first metal layer may be formed by depositing a metal containing copper, and the second metal layer may be formed by depositing a metal containing titanium or molybdenum.

According to at least one embodiment, the etchant may include (A) a copper ion source; (B) a source of an organic acid ion having one or more carboxyl groups in a molecule; (C) a fluoride ion source; (D) an etching controller, a surface oxidizing power enhancer, or a combination thereof, as a first additive; and (E) a surfactant, as a second additive.

FIGS. 6A, 8A, 9A, and 10A are plan views sequentially illustrating a method of manufacturing a display device according to at least one embodiment.

FIGS. 5, 6B, 7, 8B, 9B, 10B, and 11 are cross-sectional views sequentially illustrating a method of manufacturing a display device according to at least one embodiment.

FIGS. 6B, 8B, 9B, and 10B are cross-sectional views taken along line I-I' of FIGS. 6A, 8A, 9A, and 10A, respectively.

The display board may include an insulating substrate including a plurality of pixel regions, a plurality of gate lines, a plurality of data lines, a plurality of common electrode lines, and a plurality of pixels. Here, since each pixel has the same structure, a single pixel of the pixels, two gate lines GL adjacent to the pixel, and two data lines DL are illustrated for convenience of explanation.

Figure 11:
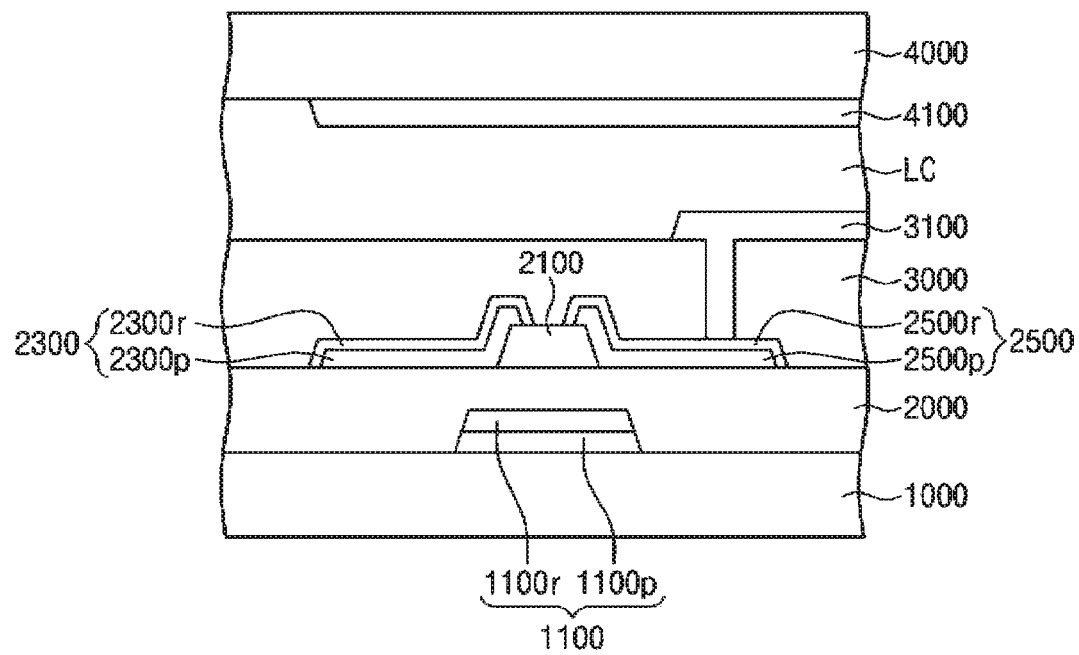

With reference to FIG. 11, the display board includes a thin film transistor TFT, and the thin film transistor TFT may include a gate electrode 1100, a gate insulating film 2000, a semiconductor pattern 2100, a source electrode 2300, and a drain electrode 2500. The thin film transistor is formed by patterning in a photolithography process.

Figure 5:
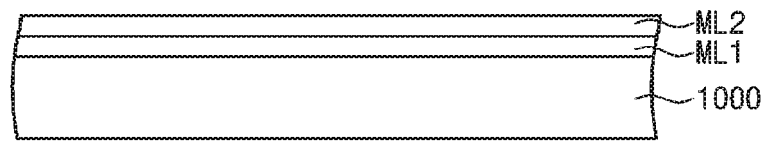

With reference to FIG. 5, a first metal layer ML1 and a second metal layer ML2 are sequentially stacked on a substrate 1000. The first metal layer may be formed by depositing metal containing copper, and the second metal layer may be formed by depositing metal containing titanium or molybdenum.

Figure 6A:
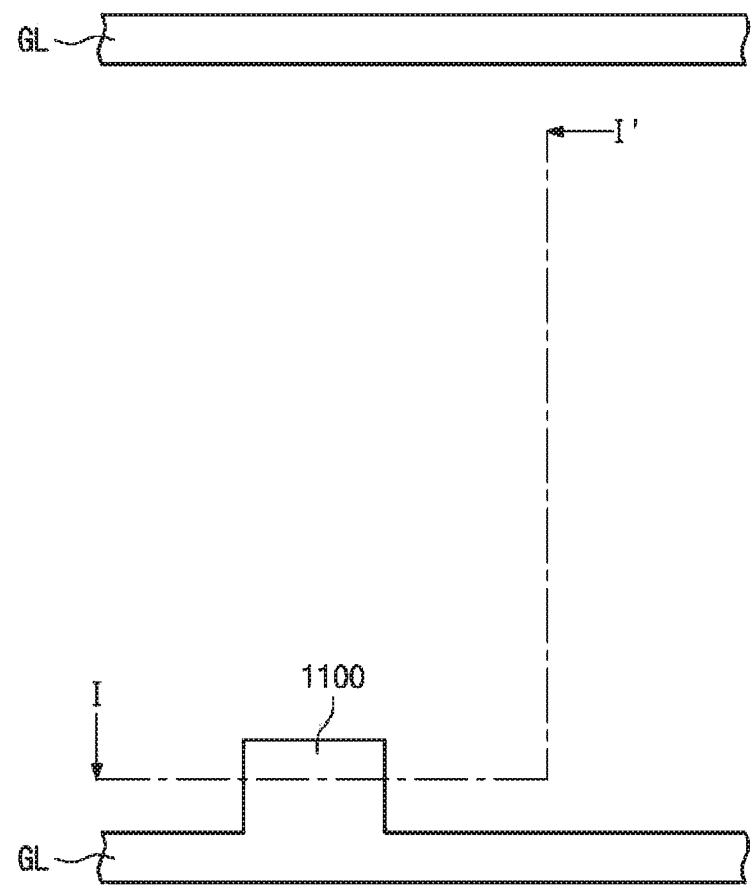
Figure 6B:
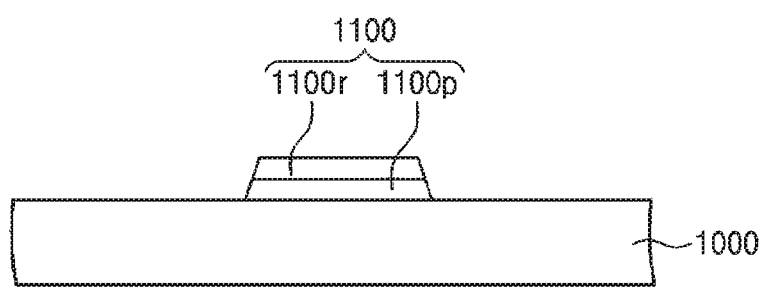

FIGS. 4A, 6A, and 6B, the first metal layer ML1 and the second metal layer ML2 are etched using an etchant to form a gate pattern of a gate line GL and the gate electrode 1100 on the substrate 1000 (s100). The etchant may include: (A) a copper ion source; (B) a source of an organic acid ion having one or more carboxyl groups in a molecule; (C) a fluoride ion source; (D) an etching controller, a surface oxidizing power enhancer, or a combination thereof, as a first additive; and (E) a surfactant, as a second additive. Each of the gate line GL and the gate electrode 1100 may be formed of a first gate metal layer 1100$p$ and a second gate metal layer 1100$r$.

Figure 7:
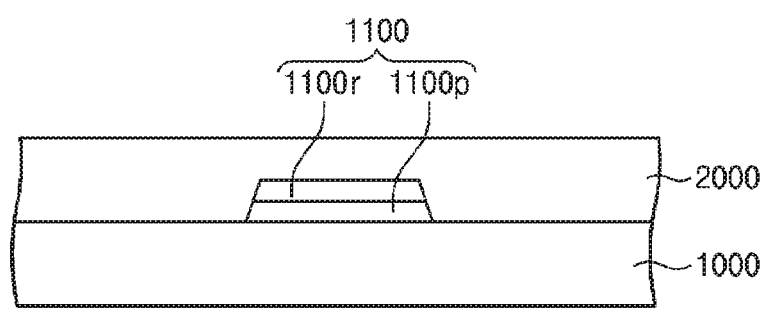

With reference to FIG. 7, a gate insulating film 2000 is formed on the substrate 1000 in which the gate electrode 1100 is formed. The gate insulating film 2000 is disposed on the gate electrode 1100 to cover the gate electrode 1100.

Figure 8A:
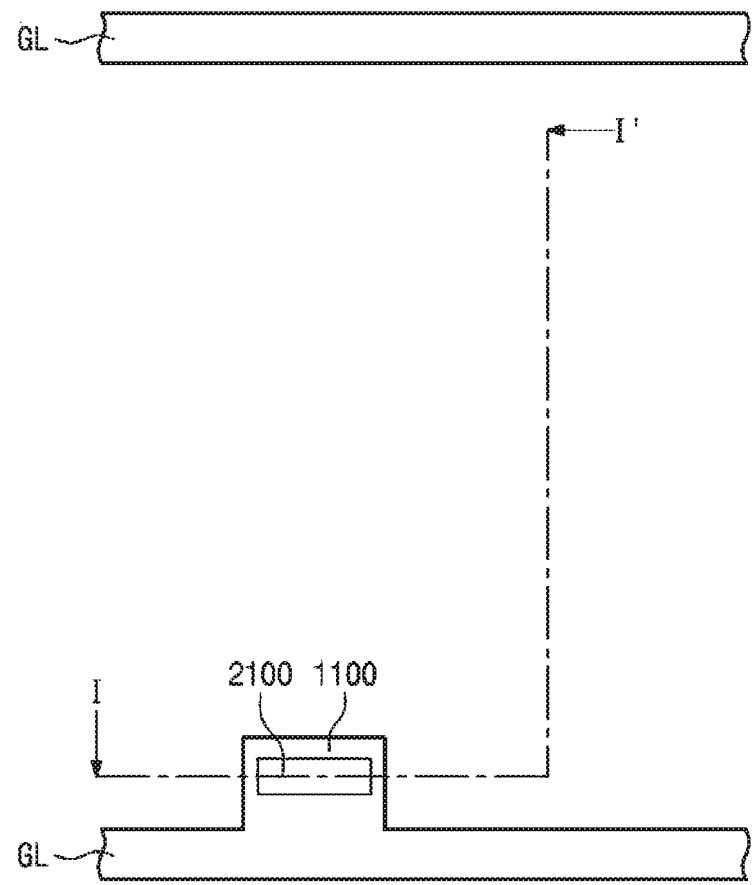
Figure 8B:
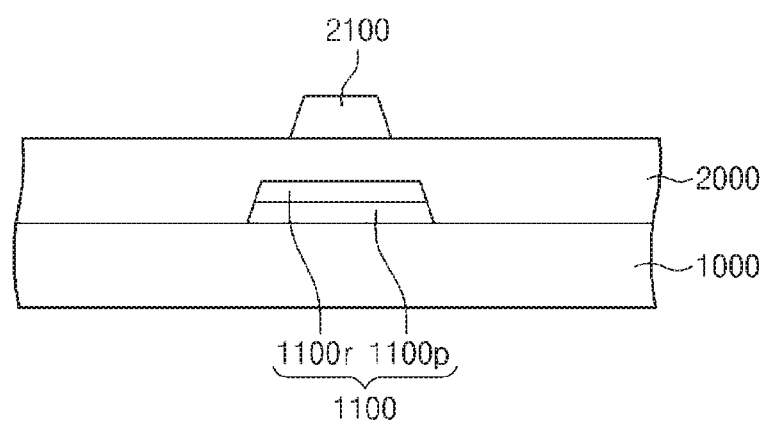

With reference to FIGS. 4A, 8A, and 8B, a semiconductor pattern 2100 is formed on the gate insulating film 2000 (s200). The semiconductor pattern 2100 may oppose the gate electrode 1100 with the gate insulating film 2000 interposed therebetween.

Figure 9A:
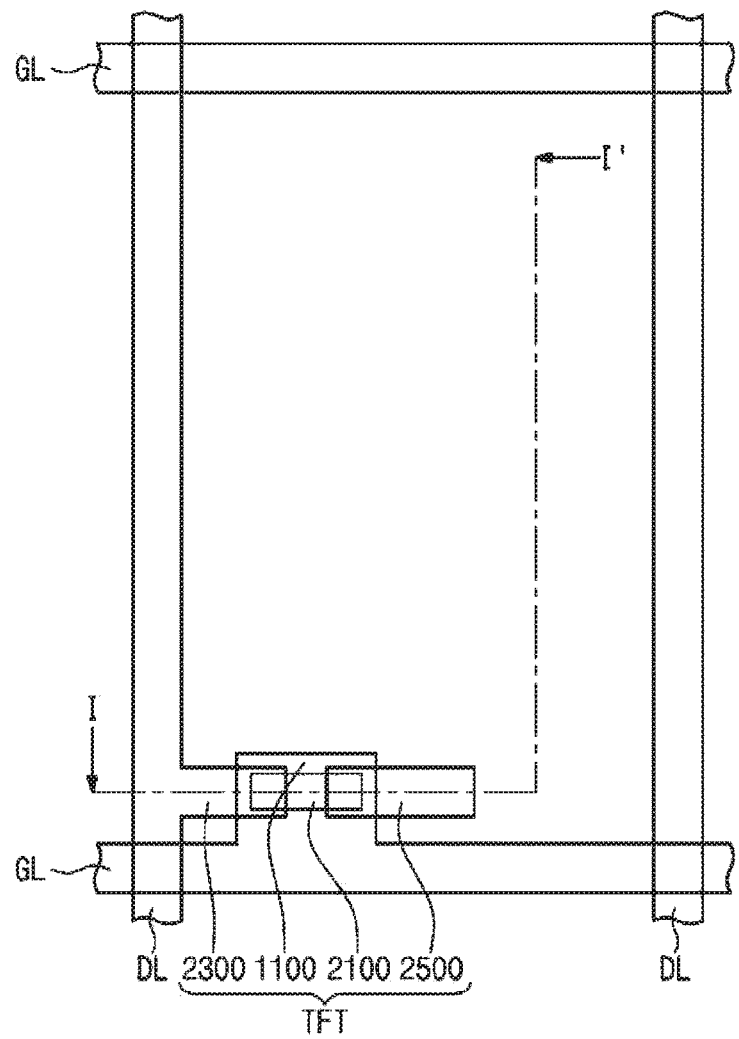
Figure 9B:
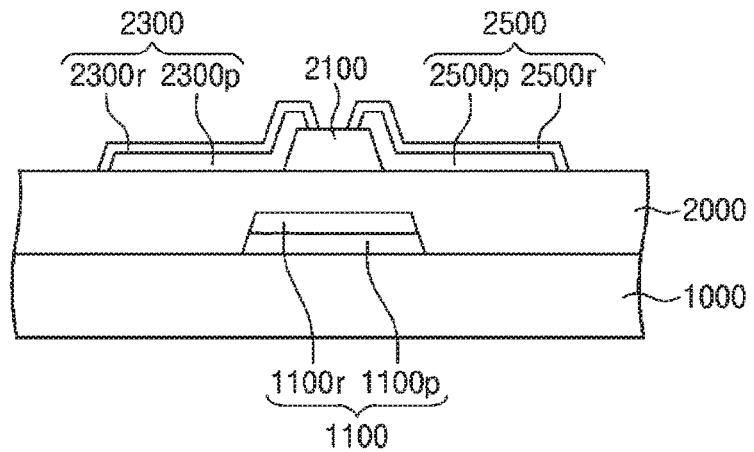

With reference to FIGS. 4A, 9A, and 9B, a data pattern is formed on the semiconductor pattern 2100 (s300). The data pattern may include a data line DL intersecting, while being insulated from, the gate line GL, a source electrode 2300 connected to the data line DL, and a drain electrode 2500. The data line DL may be formed by etching a first data metal layer (not shown) formed by depositing metal containing copper and a second data metal layer (not shown) formed by depositing metal containing titanium or molybdenum with the etchant. In addition, the source electrode 2300 may be formed by etching a first source metal layer 2300$p$ formed by depositing metal containing copper and a second source metal layer 2300$r$ formed by depositing metal containing titanium or molybdenum with the etchant. In addition, the drain electrode 2500 may be formed by etching a first drain metal layer 2500$p$ formed by depositing metal containing copper and a second drain metal layer 2500$r$ formed by depositing metal containing titanium or molybdenum with the etchant. The etchant may include: (A) a copper ion source; (B) a source of an organic acid ion having one or more carboxyl groups in a molecule; (C) a fluoride ion source; (D) an etching controller, a surface oxidizing power enhancer, or a combination thereof, as a first additive; and (E) a surfactant, as a second additive. The source electrode 2300 and the drain electrode 2500 may be spaced apart from each other, and may be connected to the semiconductor pattern 2100.

Figure 10A:
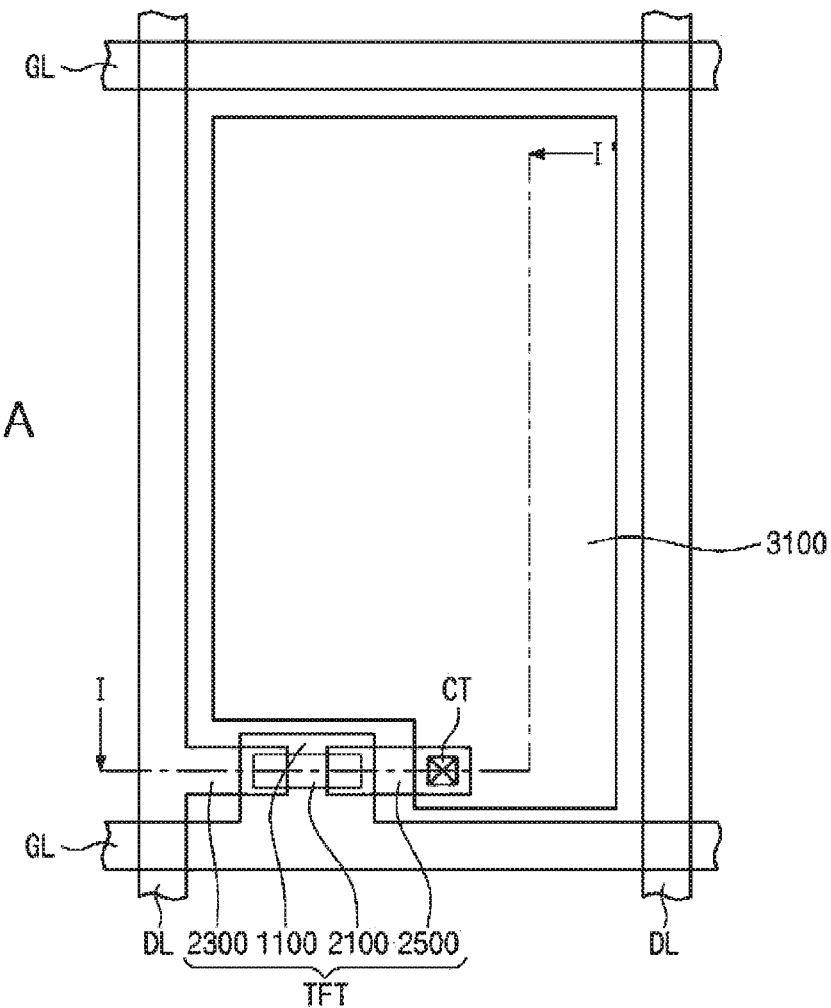
Figure 10B:
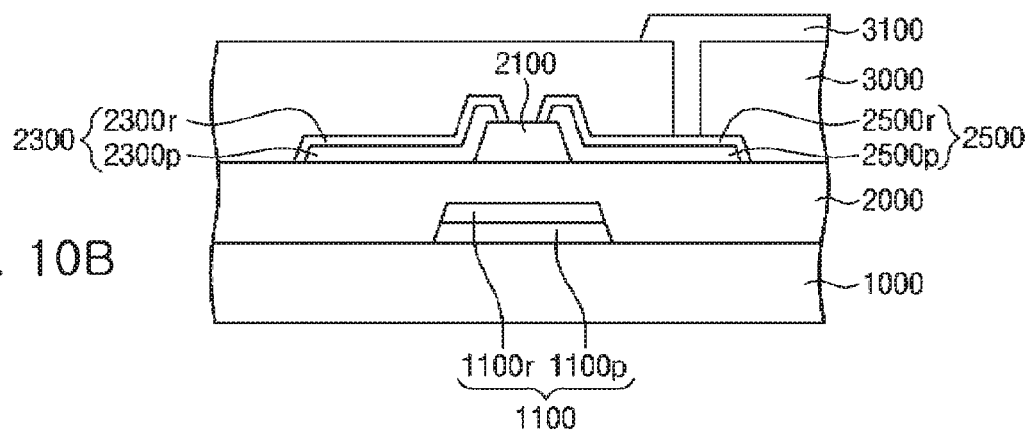

With reference to FIG. 10B, an insulating layer 3000 is formed on the source electrode 2300 and the drain electrode 2500. A contact hole CT exposing a portion of an upper surface of the drain electrode 2500 is formed in the insulating layer 3000. In addition, with reference to FIGS. 3A, 9A, and 9B, a pixel electrode 3100 is formed by patterning a transparent electrode on the insulating layer 3000. The pixel electrode 3100 may be disposed on the insulating layer 3000, and may be electrically connected to the contact hole CT.

With reference to FIGS. 4A and 11, a common electrode 4100 insulated from the pixel electrode 3100 is formed (s500). The common electrode 4100 may be formed on the substrate 1000 in which a color filter substrate 4000 or a thin film transistor is formed. In addition, a liquid crystal layer LC may be formed between the substrate 1000 in which the thin film transistor is formed and the color filter substrate 4000.

Hereinafter, the present disclosure will be described in more detail through various examples.

Preparation Example 1: Preparation of Titanium/Copper/Titanium/Glass Substrate

A layer (500 Å) formed of titanium (a metal) was formed by sputtering titanium onto a glass substrate (dimensions: 150 mm×150 mm), after a layer (8000 Å) formed of copper (a metal) was formed by sputtering copper, and a layer (500 Å) formed of titanium (a metal) was formed by sputtering titanium, and thus, a 3-layer film has a structure formed of titanium/copper/titanium. Here, a resist was applied, after a line-shaped pattern mask (a line width: 20 μm) was exposed and transferred, and developed, and thus, a titanium/copper/titanium/glass substrate in which a resist pattern was formed was manufactured.

Preparation Example 2: Preparation of Copper/Titanium/Glass Substrate

A layer (200 Å) formed of titanium (a metal) was formed by sputtering titanium on a glass substrate (dimensions: 150 mm×150 mm), after a layer (5000 Å) formed of copper (a metal) was formed by sputtering copper, and thus, a 2-layer structure was formed of copper/titanium. Here, a resist was applied, after a line-shaped pattern mask (a line width: 20 μm) was exposed and transferred, and developed, and thus, a copper/titanium/glass substrate in which a resist pattern was formed was manufactured.

Comparative Example 1—Preparation of Etchant Composition

In a polypropylene container with capacity of 100 ml, after pure water of 91.5 g, (A) copper nitrate (Wako Pure Chemical Ind., Ltd., limited grade, Molecular Weight 182.56) of 4.0 g as a copper ion source, (B) citric acid (Wako Pure Chemical Ind., Ltd., limited grade, Molecular Weight 192.13) of 4.0 g as a source of an organic acid ion, and (C) ammonium fluoride (Morita Chemical Industries Co., Ltd., Molecular Weight 37.5) of 0.5 g as a fluoride ion source were inserted thereinto and stirred, and dissolution of each component was confirmed to prepare an etchant composition.

For the content of each component of the etchant composition obtained as described above, per a liquid composition of 1 kg, a component (A) was 0.27 mol and a component (B) was 0.31 mol. In addition, a mixing ratio (a molar ratio) of the component (B) with respect to the component (A) was 1.17 times. In addition, the content of a component (C) per a liquid composition of 1 kg was calculated in double the equivalent of ammonium fluoride and the content thereof was 0.14 mol. A mixing ratio (a molar ratio) of the component (C) with respect to the component (A) was 0.5 times. A pH value of an etchant composition having been obtained was 2.5.

Comparative Examples 2 and 3, Reference Examples 1 and 2, and Examples 1 to 5: Preparation of Etchant Composition The content of each component was provided to prepare an etchant composition in the same manner as Comparative Example 1 except as illustrated in Tables 1 and 2.

TABLE 1

| Classification | | Comparative Example 1 | Comparative Example 2 | Comparative Example 3 | Reference Example 1 | Reference Example 2 |
|---|---|---|---|---|---|---|
| (A) | Type | copper nitrate | copper nitrate | copper nitrate | copper nitrate | copper nitrate |
| | Content (mol/kg) | 0.27 | 0.27 | 0.32 | 0.27 | 0.27 |
| (B) | Type | citric acid | citric acid | maleic acid | succinic acid | succinic acid |
| | Content (mol/kg) | 0.31 | 0.31 | 0.5 | 0.4 | 0.4 |
| | Mixing ratio | 1.17 | 1.17 | 1.58 | 1.48 | 1.48 |
| (C) | Type | ammonium fluoride | ammonium fluoride | ammonium fluoride | ammonium fluoride | ammonium fluoride |
| | Content (mol/kg) | 0.14 | 0.14 | 0.14 | 0.14 | 0.14 |
| | Mixing ratio | 0.51 | 0.51 | 0.42 | 0.51 | 0.51 |
| (D) | Type | — | hydrochloric acid | hydrochloric acid | hydrochloric acid | hydrochloric acid |
| | | — | — | nitric acid | sulfuric acid | sulfuric acid |
| | Content (mol/kg) | — | 0.82 | 1.43 | 1.0 | 1.0 |
| | Mixing ratio | — | 3.08 | 4.47 | 3.7 | 3.7 |
| (E) | Type | — | — | — | polyglycol oleic acid | polyglycol oleic acid |
| | Content (ppm) | — | — | — | Less than 1 | 35,000 |
| (F) | Type | — | — | — | sodium chloride | sodium chloride |
| | Content (mol/kg) | — | — | — | 0.3 | 0.3 |
| | Mixing ratio | — | — | — | 1.1 | 1.1 |
| | D.I | residue | residue | residue | residue | residue |
| | pH | 2.5 | 2.3 | 1.6 | 1.7 | 1.8 |

TABLE 2

| Classification | | Example 1 | Example 2 | Example 3 | Example 4 | Example 5 |
|---|---|---|---|---|---|---|
| (A) | Type | copper sulfate | copper sulfate | copper nitrate | copper sulfate | copper sulfate |
| | Content (mol/kg) | 0.16 | 0.32 | 0.27 | 0.32 | 0.16 |
| (B) | Type | maleic acid | maleic acid | succinic acid | acetic acid | glutaric acid |
| | Content (mol/kg) | 0.42 | 0.76 | 0.4 | 1.50 | 0.38 |
| | Mixing ratio | 2.62 | 2.36 | 1.48 | 4.69 | 2.38 |
| (C) | Type | ammonium fluoride | ammonium fluoride | ammonium fluoride | ammonium fluoride | ammonium fluoride |
| | Content (mol/kg) | 0.14 | 0.14 | 0.14 | 0.14 | 0.14 |
| | Mixing ratio | 0.84 | 0.42 | 0.51 | 0.44 | 0.88 |
| (D) | Type | iodic acid | hydrochloric acid | hydrochloric acid | iodic acid | bromic acid |
| | | sulfuric acid | nitric acid | sulfuric acid | nitric acid | sulfuric acid |
| | Content (mol/kg) | 0.5 | 0.79 | 1.0 | 1.47 | 1.0 |
| | Mixing ratio | 3.18 | 2.48 | 3.7 | 4.59 | 6.25 |
| (E) | Type | polyether-polyol | polypropylene-glycol | polyglycol-oleic acid | ethylene oxide-propylene oxide | polyethylene-glycol |
| | | — | — | — | | polyphenylene-glycol |
| | Content (ppm) | 5,000 | 5,000 | 10,000 | 5 | 10,000 |
| (F) | Type | — | potassium chloride | sodium chloride | potassium citrate | sodium citrate |
| | Content (mol/kg) | — | 0.2 | 0.3 | 0.2 | 0.2 |
| | Mixing ratio | — | 0.63 | 1.1 | 0.63 | 1.25 |
| | D.I | residue | residue | residue | residue | residue |
| | pH | 2.2 | 1.6 | 1.8 | 1.0 | 2.1 |

Experimental Example 1: Characteristics Evaluation-1

As an etchant composition according to an Example was used, a titanium/copper/titanium/glass substrate in which a resist pattern obtained in Preparation Example 1 was formed was etched to obtain an evaluation substrate. With respect to the evaluation substrate having been obtained, storage over time, accumulation over time, liquid reactivity, photoresist lifting (PR lifting), metal wiring disconnection (mouse bite), presence of precipitation, and a glass reduction amount were measured and illustrated in Table 3. On the other hand, liquid reactivity was determined by whether bubbling occurred or a color of an outer surface was changed when an etchant was left at room temperature, and photoresist lifting was determined by whether lifting of a photoresist occurred when etching under 50% over etching conditions of EPD. In addition, the presence of a precipitation was determined by whether a precipitation was generated over time (over 48 hours) after dropping an etchant on an evaluation substrate, and a glass reduction amount was determined by measuring an amount in which a glass substrate was reduced by etching when a titanium layer was etched. Other evaluations were determined using an evaluation method commonly used in the art.

low, a photoresist lifting (PR lifting) phenomenon may not occur. In addition, an amount of precipitation may be insignificant, and evaluation of metal wiring disconnections and a glass reduction amount were also excellent.

Experimental Example 2: Characteristics Evaluation-2

As an etchant composition according to the Example, the Comparative Example, and the Reference Example was used, a titanium/copper/titanium/glass substrate in which a resist pattern obtained in Preparation Example 1 was formed was etched to obtain an evaluation substrate. With respect to an evaluation substrate having been obtained, a surface residue, a multilayer film total amount removal point (End Point Detector, EPD), critical dimension loss (CD loss), and titanium tailing were measured and are illustrated in Table 4. A measurement method is as described below, and the specific meaning of terms is as illustrated in FIG. 1. On the other hand, a surface residue was confirmed by whether of presence/absence of metal on a glass substrate surface (or an insulating film), and a multilayered film total amount removal point was determined by measuring the time of a point at which copper and titanium layers were removed. In addition, critical dimension loss was determined by measuring a distance between an end of a photoresist and an end of a copper layer, and tailing was determined by measuring a distance from an end of a copper layer to an exposed titanium layer.

TABLE 3

| Classification | Storage over time [@3 months/room temperature] | Accumulation over time [based on Cu] | Liquid reactivity | Metal wiring disconnection | Precipitatation | PR lifting | Glass reduction amount [g, 7 days] |
|---|---|---|---|---|---|---|---|
| Example 1 | ○ | 20,000 ppm | ○ | ○ | ○ | ○ | ○ |
| Example 2 | ○ | 20,000 ppm | ○ | ○ | ○ | ○ | ○ |
| Example 3 | ○ | 20,000 ppm | ○ | ○ | ○ | ○ | ○ |
| Example 4 | ○ | 20,000 ppm | ○ | ○ | ○ | ○ | ○ |
| Example 5 | ○ | 20,000 ppm | ○ | ○ | ○ | ○ | ○ |

| Good | Poor |
|---|---|
| ○ | X |

As illustrated in Table 3, since an etchant composition according to at least one embodiment has a relatively long lifespan, an amount of waste liquid may be significantly reduced. Since a self-reactive factor was not present inside an etchant, liquid reactivity may be stable. Since pH was

TABLE 4

| Classification | Comparative Example 1 | Comparative Example 2 | Comparative Example 3 | Reference Example 1 | Reference Example 2 |
|---|---|---|---|---|---|
| Surface residue | X | X | ○ | ○ | ○ |
| EPD | X | ○ | ○ | ○ | X |
| CD loss | ○ | ○ | ○ | ○ | ○ |
| Tailing | ○ | ○ | ○ | ○ | ○ |

| Classification | Example 1 | Example 2 | Example 3 | Example 4 | Example 5 |
|---|---|---|---|---|---|
| Surface residue | ○ | ○ | ○ | ○ | ○ |
| EPD | ○ | ○ | ○ | ○ | ○ |
| CD loss | ○ | ○ | ○ | ○ | ○ |
| Tailing | ○ | ○ | ○ | ○ | ○ |

TABLE 4-continued

| Surface residue | | EPD | | CD loss | | Tailing | |
|---|---|---|---|---|---|---|---|
| Absence | Presence | 2 minutes or less | More than 2 minutes | 1.5 μm or less | More than 1.5 μm | 0.1 μm or less | More than 0.1 μm |
| ○ | X | ○ | X | ○ | X | ○ | X |

As shown in Table 4, when an etchant composition according to an example was used, critical dimension loss (CD loss) and titanium tailing could be significantly reduced. In addition, when an etching controller was further included, as a first additive, a multilayered film total amount removal point (EPD) could be lowered to 2 minutes or less. When a surface oxidizing power enhancer was further included, as a first additive, a surface residue could be prevented from being generated. On the other hand, when the content of a second additive, exceeding 30,000 ppm, was contained, a multilayered film total amount removal point (EPD) was beyond 2 minutes.

Experimental Example 3: Characteristics Evaluation-3

As an etchant composition according to the Example, the Comparative Example, and the Reference Example was used, a titanium/copper/titanium/glass substrate in which a resist pattern obtained in Preparation Example 1 was formed was etched to obtain an evaluation substrate. With an evaluation substrate having been obtained, a taper angle of a metal pattern, linearity and roughness, a glass substrate damage (Glass attack) were measured and are provided in Table 5. A measurement method was as illustrated below, and the specific meaning of the term was as shown in FIG. 1. On the other hand, an angle of a metal pattern was determined by measuring an angle when observing a cross section of a metal pattern, linearity and roughness were confirmed by whether an insulating film was normally covered in a step coverage in which an insulating film was stacked after etching treatment, and a glass substrate damage was confirmed by whether of a damage to a surface of a glass substrate using an electron microscope after an etching treatment.

As seen in Table 5, when an etchant composition according to at least one embodiment further included a surfactant, as a second additive, in addition to a first additive, it was confirmed that linearity and roughness thereof were good, damage to a glass substrate was also significantly reduced, and a taper angle of a metal pattern may be adjusted to 30° to 50°. In addition, when the etchant composition further included an alkali metal salt, as a third additive, in addition thereto, metal pattern roughness was improved. However, when an azole-based compound was used as a second additive or the content of a second additive, less than 1 ppm or exceeding 30,000 ppm, was contained, there were limitations on adjusting a taper angle of a metal pattern to an angle between 30° to 50°.

Experimental Example 4: Characteristics Evaluation-4

As an etchant composition according to Comparative Example 3 was used, a titanium/copper/titanium/glass substrate (Ti 500 Å/Cu 8000 Å/Ti 500 Å) in which a resist pattern obtained in Preparation Example 1 was formed, and a copper/titanium/glass substrate (Cu 5000 Å/Ti 200 Å) in which a resist pattern obtained in Preparation Example 2 was formed were etched under 30% over etching conditions of EPD, rinse-treated, and then dried using a blower. A result observed thereafter, using an electron microscope ((a) S-4800 10.0 kV 10.7 mm×30.0 k SE(M)/(b) SU9000 10.0 kV×20.0 k SE/(c) S-4800 10.0 kV 9.8 mm×50.0 k SE(M)/(d) SU9000 10.0 kV×20.0 k SE) is illustrated in FIG. 2. In this case, FIGS. 2A and 2B were the cases in which a glass substrate obtained in Preparation Example 1 was etched, and FIGS. 2C and 2D were the cases in which a glass substrate obtained in Preparation Example 2 was etched.

When an etchant composition according to Comparative Example 3, not containing a second additive, was used, as

TABLE 5

| Classification | Comparative Example 1 | Comparative Example 2 | Comparative Example 3 | Reference Example 1 | Reference Example 2 |
|---|---|---|---|---|---|
| Taper | @70° | @70° | @70~80° | @70° | @less than 30° |
| Roughness | X | X | X | ○ | ○ |
| Glass attack | ○ | ○ | ○ | ○ | ○ |

| Classification | Example 1 | Example 2 | Example 3 | Example 4 | Example 5 |
|---|---|---|---|---|---|
| Taper | @30~40° | @30~50° | @30~40° | @30~40° | @30~40° |
| Roughness | ○ | ○ | ○ | ○ | ○ |
| Glass attack | ○ | ○ | ○ | ○ | ○ |

Figure 2A:
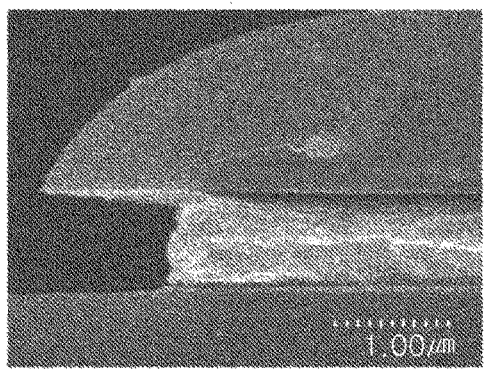
FIG. 2 is images, in which an etching result of a multi-layered film containing copper and titanium, having a composition of Comparative Example 3, is observed using an electron microscope.
Figure 2C:
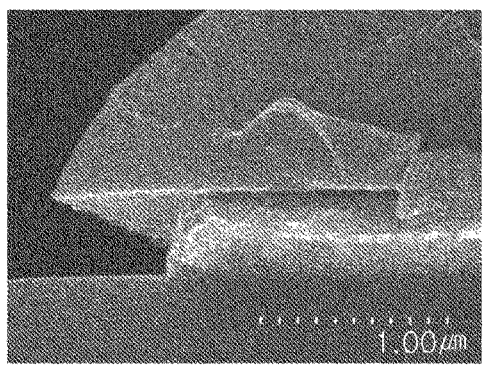
Figure 2B:
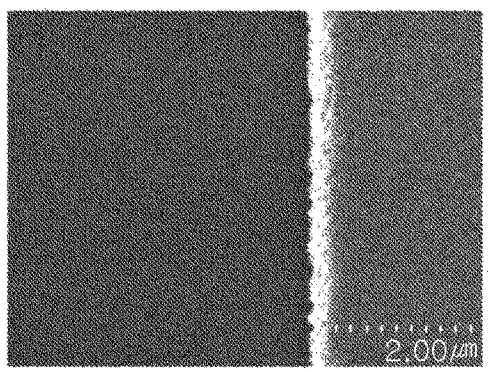
Figure 2D:
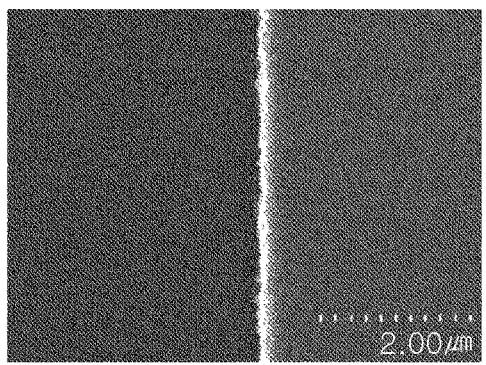

| Linearity and roughness | | Damage to glass substrate | |
|---|---|---|---|
| Good | Poor | Good | Poor |
| ○ | x | ○ | x | shown in FIGS. 2A and 2C, it was confirmed that implementation of a taper angle of 40°±10° was limited.

Experimental Example 5: Characteristics Evaluation-5

As an etchant composition according to Example 2 was used, a titanium/copper/titanium/glass substrate (Ti 500 Å/Cu 8000 Å/Ti 500 Å) in which a resist pattern obtained in Preparation Example 1 was formed and a copper/titanium/glass substrate (Cu 5000 Å/Ti 200 Å) in which a resist pattern obtained in Preparation Example 2 was formed were etched under 30% over etching conditions of EPD, rinse-treated, and dried using a blower. A result observed using an electron microscope ((a) S-4800 10.0 kV 10.7 mm×30.0 k SE(M)/(b) S-4800 10.0 kV 12.3 mm×20.0 k SE(M)/(c) S-4800 10.0 kV 8.5 mm×30.0 k SE(M)/(d) S-4800 10.0 kV 10.6 mm×50.0 k SE(M)/(e) SU9000 10.0 kV×20.0 k SE) is illustrated in FIG. 3. In this case, FIGS. 3A, 3B, and 3C were cases in which a glass substrate obtained in Preparation Example 1 was etched, and FIGS. 3D and 3E were cases in which a glass substrate obtained in Preparation Example 2 was etched.

Figure 3A:
FIG. 3 is images, in which an etching result of a multi-layered film containing copper and titanium, having a composition of Example 2, is observed using an electron microscope.
Figure 3D:
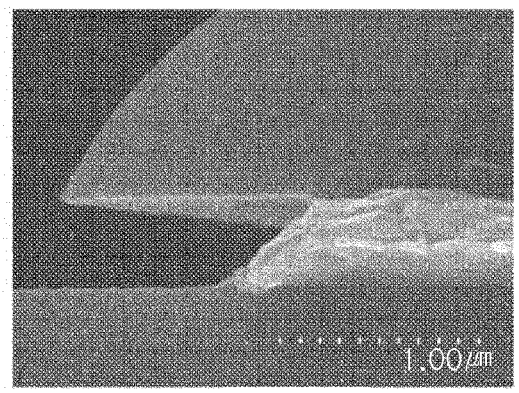
Figure 3B:
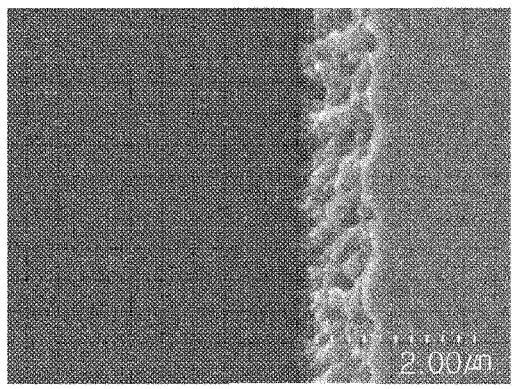
Figure 3E:
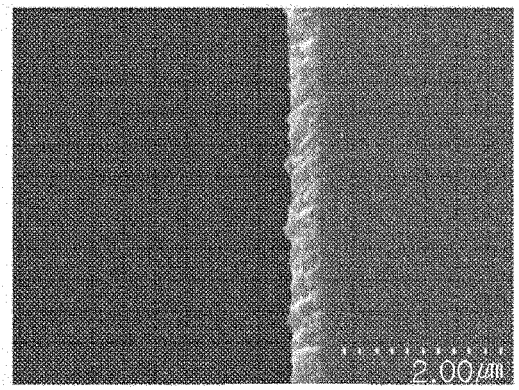
Figure 3C:

When an etchant composition according to at least one embodiment was used, as seen in FIGS. 3A and 3D, it was confirmed that a taper angle of 40°±10° could be implemented. In addition, as seen in FIGS. 3B, 3C, and 3E, it was confirmed that linearity of a pattern could be significantly increased and surface roughness could be significantly reduced.

The present disclosure has been shown and described with reference to various embodiments thereof, but is not limited thereto. It will be apparent to those skilled in the art that various changes and modifications thereof may be made within the spirit and scope of the various embodiments, and therefore to be understood that such changes and modifications belong to the scope of the appended claims.

The invention claimed is:

1. An etchant composition, comprising:
   (A) a copper ion source;
   (B) a source of an organic acid ion having one or more carboxyl groups in a molecule;
   (C) a fluoride ion source;
   (D) an etching controller, a surface oxidizing power enhancer, or a combination thereof, as a first additive; and
   (E) a surfactant, as a second additive,
   wherein the etchant composition has a pH value of 3 or less.

2. The etchant composition of claim 1, wherein, in the etchant composition, the contents of (A) to (E) are 0.02 mol/kg to 1.0 mol/kg of (A) the copper ion source; 0.01 mol/kg to 3.0 mol/kg of (B) the source of an organic acid ion having one or more carboxyl groups in a molecule; 0.01 mol/kg to 1.0 mol/kg of (C) the fluoride ion source; 0.01 mol/kg to 3.0 mol/kg of (D) the first additive; and 1.0 ppm to 30,000 ppm of (E) the second additive.

3. The etchant composition of claim 1, wherein (A) the copper ion source is at least one selected from the group consisting of copper, copper sulfate, copper nitrate, copper chloride, copper fluoride, copper phosphide, copper hydroxide, copper acetate, copper citrate, copper lactate, copper oleate, a copper silicon compound, copper bromide, and copper carbonate.

4. The etchant composition of claim 1, wherein (B) the source of an organic acid ion having one or more carboxyl groups in a molecule is at least one selected from the group consisting of formic acid, acetic acid, propionic acid, butyric acid, caproic acid, caprylic acid, capric acid, lauric acid, stearic acid, gluconic acid, citric acid, tartaric acid, malic acid, succinic acid, oxalic acid, maleic acid, and an ammonium salt thereof.

5. The etchant composition of claim 1, wherein a mixing ratio of (B) the source of an organic acid ion with respect to (A) the copper ion source is 0.01 to 150.0 times on a molar basis.

6. The etchant composition of claim 1, wherein (C) the fluoride ion source is at least one selected from the group consisting of hydrofluoric acid, ammonium fluoride, acid ammonium fluoride, potassium fluoride, ammonium fluoroborate, potassium bisulfite, potassium borofluoride, sodium fluoride, sodium bisulfite, aluminum fluoride, boron fluoride, lithium fluoride, calcium fluoride, and copper fluoride.

7. The etchant composition of claim 1, wherein a mixing ratio of (C) the fluoride ion source with respect to (A) the copper ion source is 0.01 to 50.0 times on a molar basis.

8. The etchant composition of claim 1, wherein (D) the etching controller, as a first additive, is a halogen ion source, except for a fluorine ion.

9. The etchant composition of claim 8, wherein the halogen ion source, except for the fluorine ion, is at least one selected from the group consisting of hydrochloric acid, potassium chloride, sodium chloride, ammonium chloride, bromic acid, potassium bromide, sodium bromide, ammonium bromide, iodic acid, potassium iodide, sodium iodide, and ammonium iodide.

10. The etchant composition of claim 1, wherein (D) the surface oxidizing power enhancer, as a first additive, is an inorganic acid.

11. The etchant composition of claim 10, wherein the inorganic acid is at least one selected from the group consisting of sulfuric acid, nitric acid, phosphoric acid, and hydrochloric acid.

12. The etchant composition of claim 1, wherein a mixing ratio of (D) the first additive with respect to (A) the copper ion source is 0.01 to 150.0 times on a molar basis.

13. The etchant composition of claim 1, wherein (E) the surfactant, as a second additive, is a nonionic surfactant.

14. The etchant composition of claim 13, wherein the nonionic surfactant is at least one selected from the group consisting of polyethyleneglycol, polypropyleneglycol, polyetherpolyol, polyglycololeicacid, gelatin, and an ethylene oxide (EO)-propylene oxide (PO) copolymer.

15. The etchant composition of claim 1, wherein the etchant composition further comprises (F) an alkali metal salt, as a third additive.

16. The etchant composition of claim 15, wherein (F) the alkali metal salt, as a third additive, is at least one selected from the group consisting of an alkali metal salt containing halogen, an alkali metal salt of an organic acid having one or more carboxyl groups in a molecule, and an alkali metal salt of a strong alkali.

17. The etchant composition of claim 15, wherein, in the etchant composition, the content of (F) the third additive is 0.01 mol/kg to 2.0 mol/kg.

18. The etchant composition of claim 15, wherein a mixing ratio of (F) the third additive with respect to (A) the copper ion source is 0.01 to 100.0 times on a molar basis.

19. The etchant composition of claim 1, wherein the etchant composition is provided for etching a multilayered film containing copper and titanium.

* * * * *